United States Patent [19]

Corrigan

[11] 4,188,194
[45] Feb. 12, 1980

[54] DIRECT CONVERSION PROCESS FOR MAKING CUBIC BORON NITRIDE FROM PYROLYTIC BORON NITRIDE

[75] Inventor: Francis R. Corrigan, Westerville, Ohio

[73] Assignee: General Electric Company, Worthington, Ohio

[21] Appl. No.: 812,283

[22] Filed: Jul. 1, 1977

Related U.S. Application Data

[63] Continuation-in-part of Ser. No. 736,988, Oct. 29, 1976, abandoned.

[51] Int. Cl.$^2$ .............................................. B24D 3/04
[52] U.S. Cl. ...................................... 51/307; 51/309; 264/65; 423/290
[58] Field of Search ................... 51/307, 309; 423/290; 264/65, 332

[56] References Cited

U.S. PATENT DOCUMENTS

| | | | |
|---|---|---|---|
| 3,212,852 | 10/1965 | Bundy | 51/307 |
| 3,578,403 | 5/1971 | Moore | 51/307 |
| 3,852,078 | 12/1974 | Wakatsuki et al. | 51/307 |
| 3,876,751 | 4/1975 | Alexeevsky et al. | 51/307 |
| 3,918,931 | 11/1975 | De Vries et al. | 51/309 |
| 3,944,398 | 3/1976 | Bell | 51/307 |
| 4,016,244 | 4/1977 | Susa et al. | 51/307 |

FOREIGN PATENT DOCUMENTS

| | | | |
|---|---|---|---|
| 49-22925 | 6/1974 | Japan | 51/307 |
| 49-27518 | 7/1974 | Japan | 51/307 |
| 49-30357 | 8/1974 | Japan | 51/307 |
| 50-61413 | 5/1975 | Japan | 51/307 |
| 1,317,716 | 5/1973 | United Kingdom | 51/307 |

OTHER PUBLICATIONS

Wakatsuki et al., "Synthesis of Polycrystalline CBN" Mat. Res. Bulletin, 7 999–1004 (1972).
Ichinose et al., "Synthetic of Poly CBN (v)", Procedures of 4th Conference on High Pressure, pp. 436–440 (1974).
Wakatsuki et al., "Synthesis of Poly CBN (VI)", Proceedings of 4th Int. Conf. on High Pressure, pp. 441–445, Koyoto Japan (1974).
G. S. Slack, "Non Metallic Crystals with High Thermal Conductivity" J. Phys. Chem. Solids, 34, 321 (1973).
B. J. Pope, et al. "High Thermal Conductivity Microwave Substrates" Semi-annual report, Jul.–Dec. 1973, ECOM Report 0289-1.
B. J. Pope, et al., "High Thermal Conductivity Microwave Substrates" Final Report, Jul. '73–Sep. '74 Report No. ECOM-73-0289-F.
B. J. Pope, et al., "Sintered Diamond, Its possible Use as a High Thermal Cond. Semi—conductor Device Substrate" 4th Air Conf. 1974.

*Primary Examiner*—Donald J. Arnold
*Attorney, Agent, or Firm*—Morgan, Finnegan, Pine, Foley & Lee

[57] ABSTRACT

A process for making a sintered polycrystalline cubic boron nitride (CBN) compact by direct conversion of a pyrolytic, preferably substrate nucleated, boron nitride (PBN). Direct conversion takes place by subjecting the PBN to temperatures and pressures within the CBN stable region. The crystallites of the compact produced by this process are preferentially oriented. Also, such compacts have a high thermal conductivity between about 2 watts/cm° K. and 9 watts/cm° K. and thus are useful as a heat sink for electronic devices. The size of the CBN crystallites of the compact may be between about $1 \times 10^3$ Å to $1 \times 10^5$ Å.

7 Claims, 20 Drawing Figures

HBN

CBN

WBN

BUNDY & WENTORF BN PHASE DIAGRAM

○ CONVERSION RUNS — SHADING = DEGREE OF CONVERSION
□ RECONVERSION RUNS — SHADING = DEGREE OF RECONVERSION

THERMAL CONDUCTIVITY, CBN COMPACTS

DIRECT CONVERSION PROCESS FOR MAKING CUBIC BORON NITRIDE FROM PYROLYTIC BORON NITRIDE

CROSS REFERENCE TO RELATED APPLICATIONS

This is a continuation-in-part of application Ser. No. 736,988 filed on Oct. 29, 1976, in the name of F. R. Corrigan now abandoned.

U.S. patent application Ser. No. 394,632, filed on Sept. 6, 1973, by F. R. Corrigan, entitled Large Particle Boron Nitride Abrasive Particles and now abandoned and assigned to the assignee of the invention herein and U.S. patent application Ser. No. 653,981, filed on Jan. 30, 1976 and now abandoned, as a division of the aforenoted Ser. No. 394,632 are directed to preferentially oriented cubic and wurtzite boron nitride particles and a dynamic shock process for making said particles from pyrolytic boron nitride. These applications are hereby incorporated herein as reference.

BACKGROUND OF THE INVENTION

This invention relates to processes for making polycrystalline abrasive compacts and, more particularly, it relates to a direct conversion process for making a cubic boron nitride (CBN) compact from hexagonal boron nitride (HBN) and the resulting product.

Three crystalline forms of boron nitride are known: (1) soft graphitic (hexagonal) form (HBN) similar in structure to graphite carbon, (2) a hard wurtzitic (hexagonal) form (WBN) similar to hexagonal diamond, and (3) a hard zincblende (cubic) form (CBN) similar to cubic diamond.

The three BN crystal structures may be visualized as formed by the stacking of a series of sheets (layers) of atoms. In the low pressure graphitic structure the stacking layers are made up of planar fused hexagons (like bathroom tile) in which the vertices of the hexagons are occupied alternately by boron and nitrogen atoms and stacked vertically such that the B and N atoms also alternate in the stacking [001] direction as illustrated in FIG. 1A. In the more dense CBN and WBN crystal structures the atoms of the stacking layers are puckered out-of-plane and the two dense structures result from variation in the stacking of the layers. As illustrated in FIGS. 1B and 1C, the layer stacking sequence of the CBN and WBN structures can therefor be symbolized as ... A B C A ... and ... A B A B ... respectively.

In HBN and WBN crystals the layers are stacked along the [001] direction (i.e. the c crystallographic axis is perpendicular to the layers) whereas in the CBN crystal the layers are stacked along the [111] direction. These layers are referred to as hexgonal stacking layers or planes. In HBN, bonding between the atoms within the layers is predominantly of the strong covalent type, but with only weak van der Waals bonding between layers. In WBN and CBN, strong, predominantly covalent tetrahedral bonds are formed between each atom and its four neighbors.

Hard phase BN compacts are of two general types: a cluster compact and a composite compact.

A cluster compact is defined as a cluster of abrasive crystals bonded together either (1) in a self-bonded relationship, (2) by means of a bonding medium disposed between the crystals or (3) by means of some combination of (1) and (2). Reference can be made to U.S. Pat. Nos. 3,136,615 and 3,233,988 for a detailed disclosure of certain types cluster compacts and methods for making same.

A composite compact is defined as a cluster compact bonded to a substrate material, such as cemented tungsten carbide. The bond to the substrate can be formed either during or subsequent to the formation of the cluster compact. Reference can be made to U.S. Pat. Nos. 3,743,489 and 3,767,371 for a detailed disclosure of certain types of composite compacts and methods for making same.

Known process for making CBN compacts can be generally classified in four categories and are so defined as used herein as follows: (1) catalytic conversion process, a one-step process in which a catalyst metal or alloy aids in the transition of HBN to CBN simultaneously with the formation of the compact; (2) bonding medium process, a two-step process in which the first step comprises the conversion of HBN to CBN and the second step comprises the formation of a compact from cleaned CBN crystals mixed with a metal or alloy which aids in the bonding of the CBN into a compact; (3) direct sintering process, a two-step process which is the same as process (2) except that compact is formed without addition of metal or alloy to aid in bonding CBN crystals; and (4) direct conversion process, a one-step process in which substantially pure HBN is directly transformed to a CBN compact without the aid of a catalyst and/or a bonding medium.

The catalytic and bonding medium processes are generally disadvantageous because the catalysts and bonding medium are lower in hardness than CBN and are retained in the resultant mass which reduces the hardness and abrasive resistance of the masses. Particular reference can be made to U.S. Pat. No. 3,233,988, col. 4, line 3, through col. 6, line 41 and to U.S. Pat. No. 3,918,219 for a more detailed discussion of catalytically formed CBN compacts and to U.S. Pat. Nos. 3,743,489, 3,767,371 for the details of CBN compacts utilizing a bonding medium.

The direct conversion process, while theoretically possible, has been found, in practice, to have high losses because it is difficult to consistently achieve a sufficient number of crystal to crystal bonds distributed uniformly throughout the compact. Without such, the strength and density of the compact are less than ideal.

The direct conversion under static pressure conditions of HBN to the more dense wurtzitic or cubic (zincblende) phases at pressures of 100 kbars and above is described in detail in J. Chem. Phys., 38, pp. 1144–49, 1963, Bundy, et al., and in U.S. Pat. No. 3,212,852. A disadvantage of this method is that in the pressure range above about 100 kbar the effective reaction volume is limited which limits the size of the converted polycrystalline compact products.

More recently, numerous reports and patents have been published concerning the direct conversion of HBN to CBN cluster compacts at pressure below 100 kbar. Representative of these publications are:

1. Wakatsuki et al., Japanese Pat. No. Sho 49-27518.
2. Wakatsuki et al., Japanese Pat. No. Sho 49-30357.
3. Watasuki et al., Japanese Pat. No. Sho 49-22925.
4. Wakatsuki et al., U.S. Pat. No. 3,852,078.
5. Wakatsuki et al., "Synthesis of Polycrystalline Cubic Boron Nitride", Mat. Res. Bull., 7, 999–1004 (1972).
6. Ichinose et al., "Synthesis of Polycristalline Cubic BN (V)", Proceedings of the Fourth International Conference on High Pressure, Kyoto, Japan (1974), pp. 436–440.
7. Wakatsuki et al., "Synthesis of Polycrystalline Cubic Boron Nitride (VI)", Proceedings of the Fourth International Conference on High Pressure, Kyoto, Japan (1974), pp. 441–445.
8. Sirota, N. British Pat. No. 1,317,716, "Process for the Production of Cubic Boron Nitride", May 23, 1973.

Publications Nos. 1 through 7 report direct conversion occurs at pressures >50 kbar (preferably 60 kbar and above) and temperatures >1100° C., while Publication No. 8 reports conversion at pressures of 60 to 1 kbar and higher over the temperature range from 1800° C. to 3000° C.

The publications generally used HBN powder as the starting material. Two publications (Pubs. 6 and 7) reported the use of pyrolytic boron nitride (PBN) as the starting material. Reference can be made to U.S. Pat. Nos. 3,152,006 and 3,578,403, respectively, (which are hereby incorporated herein by reference) for a more detailed description of PBN and R-PBN and acceptable processes for making it.

Publication No. 6 reports the use of PBN as a starting material for the synthesis of CBN cluster compacts in a direct conversion process practiced at a pressure of 69 kbars and a temperature of between 1800° C. and 1900° C. The resultant product (TABLE 1, p. 436) was characterized as a "soft mass" having varying amounts of unconverted HBN.

Publication No. 7 also reports the use of PBN as a starting material for the synthesis of wurtzitic boron nitride (WBN) and CBN. There were no reported results of the successful formation of either WBN or CBN using PBN as a starting material. See TABLE 1, p. 442.

PBN is a low pressure form of HBN made typically by thermal composition of $BCl_3 + NH_3$ vapors on a graphite substrate. As deposited, it has a high purity of 99.99+%, a density between about 2.0 and 2.18 g/cm$^3$ (compared to 2.28 for crystalline HBN), a crystalline size between 50 and 100 Å and a preferred crystallite orientation between 50° and 100° in the [001] direction (c-axis). The structure of PBN, as with analogous pyrolytic carbon in the carbon system, is not well understood. Various models have been proposed to explain the structure of PBN and pyrolytic carbons. According to one of the more popular models, termed turbostratic state, the B and N atoms form more or less parallel stacks of fused hexagon graphite BN like layers, but with stacking being random in translation parallel to the layers and random in rotation about the normal to the layers. Other models emphasize imperfections and distortion within the layers. The increased interlayer spacing in the pyrolytic materials (3.42 Å for PBN compared to 3.33 Å for crystalline HBN) is attributed primarily to the disorder in the stacking direction resulting in attenuation of the weak van der Waals attraction between the layers.

Although highly disordered, PBN is not completely devoid of crystallographic order (not amorphous). There is, though imperfect, organization of the B and N atoms into graphite-like layers: it is the ordered stacking arrangement of the layers which is most conspicuously absent. Extensive structural transformation is required to convert pyrolytic BN to the HBN structure shown in FIG. 1.

The "as deposited" type of PBN will be referred to hereinafter as unrecrystallized PBN (U-PBN).

Another known type of PBN is recrystallized PBN (R-PBN). It is formed by compression annealing of PBN and has a theoretical density of 2.28 g/cm$^3$, a highly crystalline structure with an interlayer spacing of 3.33 Å, a purity of 99.99+%, and a preferred crystallite orientation of about 2° in the [001] direction (c-axis).

Each type of PBN is made and commercially available in the form of a solid continuous sheet having the hexagonal stacking planes of each crystallite aligned with major planes of the sheet to the degree of preferential orientation. Thus the hexagonal stacking planes (001) of U-PBN are disposed at angles varying between about 50° and 100° with major planes of the sheet, while the (001) planes of the R-PBN are disposed at angles varying between about 2° or less with the major planes of a sheet.

R-PBN is further described in U.S. Pat. No. 3,578,403 which is hereby incorporated by reference herein.

PBN can be also classified as either "substrate nucleated" or "continuously renucleated". Substrate nucleated PBN is characterized as material substantially free of co-deposited gas-phase formed particles which act as new nucleation sites. Continuously renucleated material is characterized by the presence of co-deposited gas-phase formed particles which result in continuous renucleation during the deposition process. The concentration of co-deposited gas-phase formed particles and thus the degree of renucleation is reflected in the size of the growth cones developed during the deposition process. Large growth cones are characteristic of substrate nucleated material and is thus associated with a low degree of renucleation, and vice versa. The growth cone structure can be observed under low power magnification. The terms "substrate nucleated" and "continuously renucleated" PBN define more or less end point types of microstructure. A range of the microstructures exist between the continuously renucleated microstructure containing a high concentration of co-deposited gas-phase formed particles to the substrate nucleated structure free of co-deposited particles.

Also, the aforementioned U.S. Pat. No. 3,212,852, col. 10, lines 19–24, discloses the use of PBN as a starting material in direct conversion processes practiced at pressures above 100 kbars.

It has been found through experiment that the cluster compacts produced in accordance with the teaching of the foregoing prior art publications still fail to achieve desired performance levels in tests designed to measure the effectiveness of such compacts for cutting tool inserts.

Additionally, the trend to miniaturization in electronics has led to the need for improved heat dissipating substrates for solid state devices. For example, in nearly all microwave devices, heat generated during operation leads to decreased efficiency; and dissipation of the heat generated is the critical factor limiting operation. A commonly used heat sink material oxygen free high thermal conductivity copper has a thermal conductivity of approximately 4 W/cm°C. at room temperature. For applications where excellent dielectric properties are required, sintered beryllium oxide is commonly used even though its thermal conductivity is only about one-half that of copper. A combination of high thermal conductivity and good dielectric properties is highly desirable in a new substrate material.

Type IIa single crystal diamond has the highest room temperature thermal conductivity of any known material and is currently being used to a limited extent for some microwave devices. Known applications for improved heat dissipating diamond substrates range from heat sinks for solid state microwave generators, such as Gunn and IMPATT diodes, through solid state lasers, high power transistors and integrated circuits. It is not extensively used because of cost and difficulty in shaping.

A high thermal conductivity material, less costly than Type IIa single crystal diamond would be highly desirable if it also had good dielectric properties and could be molded in larger pieces than Type IIa diamond.

In addition to diamond, CBN has been suggested as a possible dielectric heat sink material. In Slack, J. Phys, Chem. Solids 34, 321 (1972), pure single crystal CBN was predicted to have a room temperature thermal conductivity of $\sim 13$ W/cm°C. Until recently maximum values of only $\sim 2$W/cm°C. have been reported for sintered CBN compacts. In Japanese Patent No. 50-61413, however, thermal conductivity values as high as 6.3 W/cm°C. for isotope enriched sintered CBN compacts have been reported compared with 1.7 W/cm°C. for sintered compacts of naturally occurring isotope concentration.

Accordingly, an object of this invention is to provide strong, abrasive resistant CBN cluster compacts with improved performance characteristics.

Another object of this invention is to produce large sized CBN cluster compacts by the direct conversion of HBN under high pressure and high temperature (HP/HT) conditions.

Another object of this invention is to produce CBN cluster compacts in sufficiently large sizes to be useful in material removal applications and at HP/HT conditions which are more economical.

Another object of this invention is to prepare CBN cluster compacts having a room temperature (300° K.) thermal conductivity (k) greater than 2 watts/cm°K and preferably greater than 6 watts/cm°K.

Another object of this invention is to prepare CBN cluster compacts of high thermal conductivity by direct conversion of HBN to CBN in which the crystallite size is larger than the room temperature phonon mean free path length and the thermal resistance between grains (crystallites) is not increased by grain boundary oxide contamination.

Another object of this invention is to economically produce CBN cluster compacts having thermal conductivity values suitable for electronic heat sink application.

Another object of this invention is to produce high thermally conductive cluster compacts of high electrical resistance, low relative permittivity and low dielectric loss tangent.

Another object of this invention is to produce high thermal conducting polycrystalline CBN compacts free of secondary binder or sintering aid phases.

Another object is to produce polycrystalline CBN compacts free of impurities (particularly oxygen and nitrogen impurities) which would act as phonon scattering centers and thus limit the thermal conductivity.

SUMMARY OF THE INVENTION

The foregoing objectives are achieved by the direct transformation of PBN at pressures in excess of 60 kbar and preferably about 65 kbar, and at temperatures of about 1800° C. to 2000° C. and higher within the CBN stable region. HP/HT conditions are maintained for times sufficiently long enough to allow for transition of the PBN to the cubic phase and development of strong inter-crystalline bonding. Substrate nucleated PBN is the preferred starting material with which superior results are achieved. The product of this process is a hard, abrasion resistant CBN cluster compact having preferentially oriented crystallites. Also, by the transformation of the PBN in a restricted temperature range (preferably about 2100° C. to 2500° C.) CBN cluster compacts with a thermal conductivity between approximately 2 and 9 watts/cm°C. and with a crystallite size from less than 1000 Å to greater than $1 \times 10^5$ Å are produced.

DESCRIPTION OF PREFERRED EMBODIMENTS

FIGS. 2-5 are cross-sectional views of cylindrical reaction cells 11, 201, 13, and 15, respectively, suitable for use with a conventional belt type HP/HT apparatus used in the formation of a CBN cluster compact according to the features of this invention. One preferred embodiment of the belt apparatus is also briefly shown in FIG. 2 with the reaction cell 11 disposed therein and is fully disclosed in U.S. Pat. No. 2,941,248 which is hereby incorporated by reference herein.

Figure 1A:
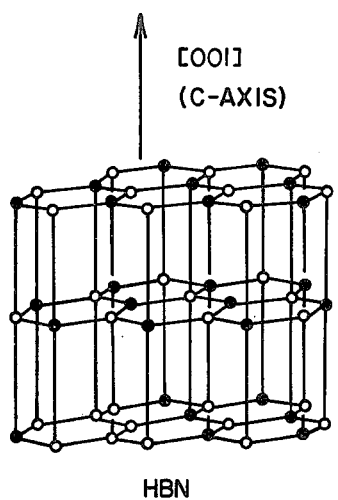
FIGS. 1A, 1B, and 1C are schematic illustrations of the atomic crystal structure of HBN, CBN and WBN, respectively.
Figure 1B:
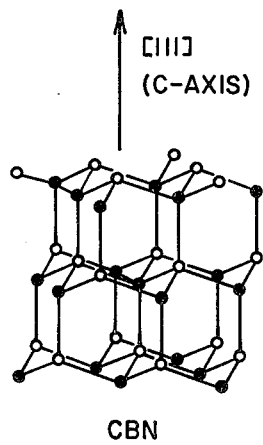
Figure 1C:
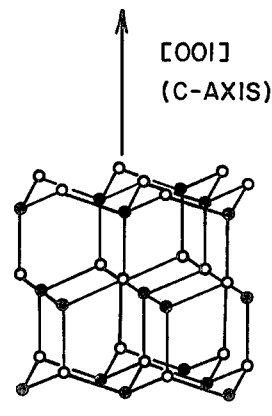
Figure 2:
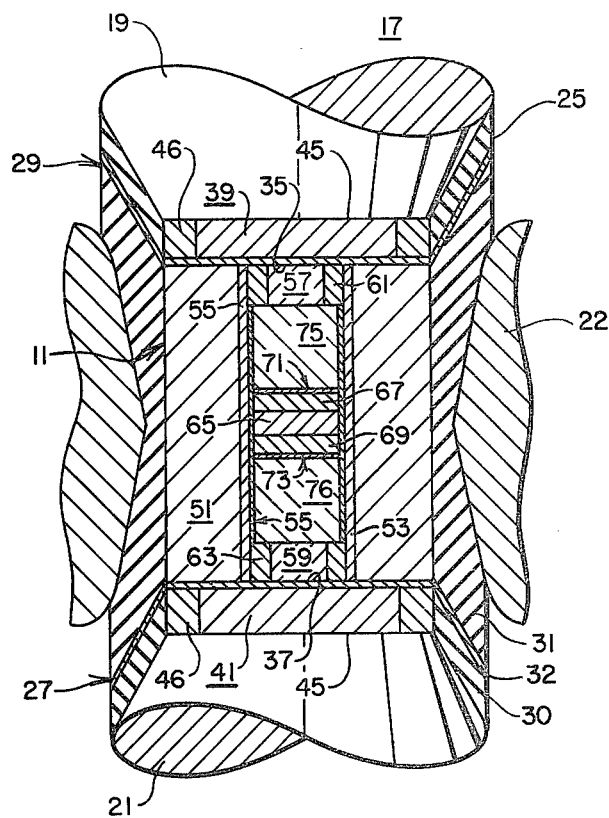
FIG. 2 is a fragmentary axial cross-sectional view of a HP-HT apparatus including one preferred embodiment of a reaction cell used in the practice of this invention.

In FIG. 2, apparatus 17 includes a pair of cemented tungsten carbide punches 19 and 21 and an intermediate belt or die member 22 of the same material. Die member 22 includes an aperture 25 in which reaction cell 11 is positioned. Between punch 19 and die 22 and between punch 21 and die 22 there are gasket/insulating assemblies 27, 29, each comprising a pair of thermally insulating and electrically non-conducting pyrophyllite members 30 and 31 and an intermediate metallic gasket 32.

Reaction cell 11 includes a lava cylindrical bushing 51. Bushing 51 may alternatively be made of glass, soft ceramic, talc, steatite or forms of pyrophyllite or soapstones. Positioned concentrically within and adjacent bushing 51 is a graphite resistance heater tube 53. Within tube 53 there is in turn concentrically positioned a contamination shield tube 55 of tantalum. Disposed outwardly of shield tube 55 and closing each end of heater tube 53 are heater tube plugs 57, 59 of hot pressed boron nitride or other high temperature insulating material. Plugs 57, 59 are surrounded by electrically conductive carbon sleeves 61, 63, respectively.

Electrically conductive metal end discs 35 and 37 are utilized at each end of graphite heater tube 53 to provide electrical connection thereto. Adjacent each disc 35, 37 is an end cap assembly 39 and 41 each of which comprises a pyrophyllite plug or disc 45 surrounded by an electrically conducting steel ring 46.

A disc 65 of PBN starting material is centrally disposed within shield tube 55. A pair of spacer discs 67, 69 of carbon are disposed one on each side of disc 65. A pair of contamination shield discs 71, 73 of tantalum are disposed outwardly of the spacer discs 67, 69. Outwardly of shield discs 71, 73 and closing the respective ends of shield tube 55 are a pair of electrically insulating discs 75, 76 of hot pressed BN.

The shield tube 55 and shield discs 71, 73 serve to prevent diffusion of or act as a getter for contaminants, which have been found to interfere with the conversion and sintering process, into the sample during conversion under HP/HT conditions.

Other metals which do not interfere with the conversion/sintering process and prevent impurity penetration into the PBN sample could also be used as shielding material. Other metallic shields may include, but not limited to, Group 4 metals such as titanium and vanadium, Group 5 metals such as zirconium, molybdenum and niobium, and Group 6 metals such as hafnium and tungsten.

Figure 3:
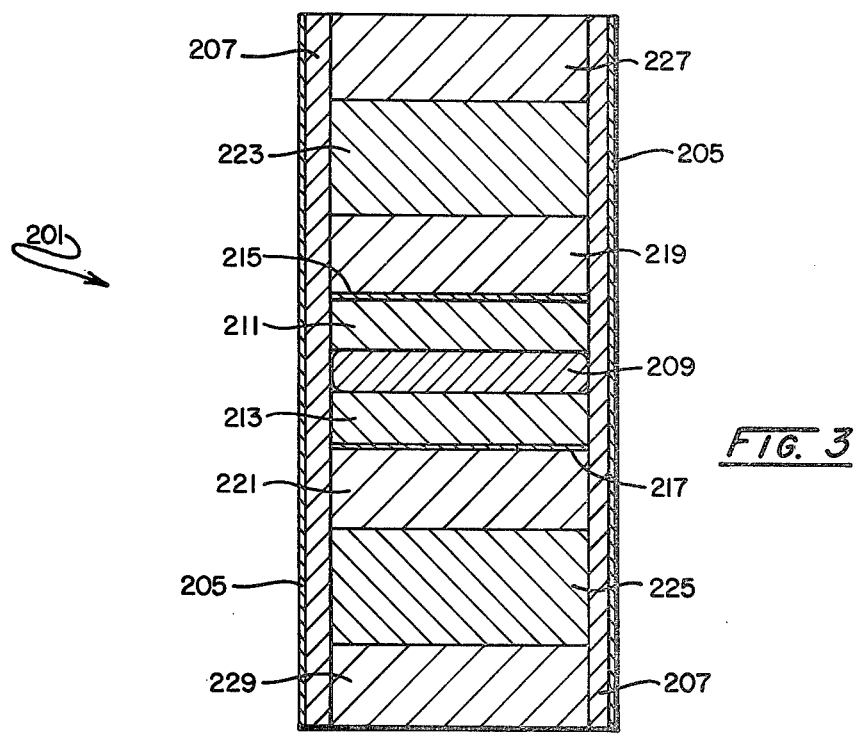
FIG. 3 is a fragmentary axial cross-sectional view of a second preferred embodiment of a HP/HT reaction cell used in the practice of this invention.

FIG. 3 shows a second preferred embodiment of a reaction cell 201 for the practice of the invention. Reaction cell 201 includes a lava cylindrical bushing (now shown) as in FIG. 2. Positioned concentrically within and adjacent to the bushing is a contamination shield tube 205 of tantalum. Within tube 205 there is in turn concentrically positioned a graphite resistance heater tube 207.

A bevel edged disc 209 of PBN starting material is centrally disposed within heater tube 207. A pair of spacer discs 211, 213 of carbon are disposed one on each side of disc 65. A pair of contamination shield discs 215, 217 of tantalum are disposed outwardly of the spacer discs 67, 69. Outwardly of shield discs 215, 217 are, in order, a pair of electrically insulating hot pressed BN discs 219, 221; a pair of carbon discs 223, 225; and a second pair of hot pressed BN discs 227, 229. This cell construction has been found to be superior to that of FIG. 2 in that lamination of the Ta tube 205 to the compact formed from starting material disc 209 is avoided by the disposition of heater tube 207 intermediate disc 209 and tube 205 and fewer cracks are found in the compacts produced in such cells.

In accordance with another feature of this invention, it has been found to be advantageous, in order to additionally reduce cracks in the cluster compacts produced in such cells, to round or bevel the circumferential edge of the starting material disc 209. This is believed to relieve edge stresses incurred during decompression of the cell, thereby yielding a further reduction in the incidence of compact cracking. The bevel edge shape of the disc 209 is retained in the converted cluster compact. In forming a cutting tool from such a cluster compact the bevel edge may be ground away if desired.

Figure 4:
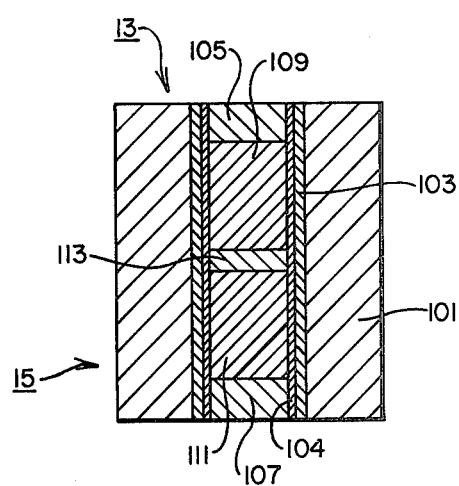
FIGS. 4 and 5 are cross-sectional views of alternative embodiments of reaction cells used in the practice of this invention.
Figure 5:
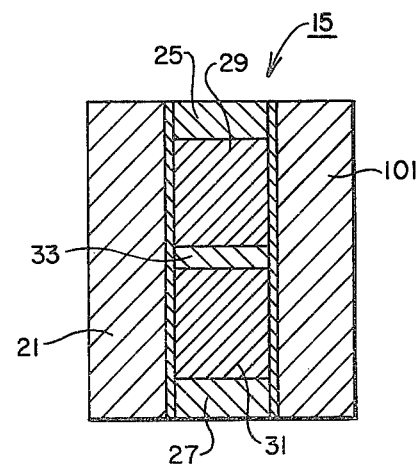

FIGS. 4 and 5 illustrate in cross section alternate reaction cell designs, although not preferred, which have been successfully used in the practice of this invention. As will be explained, these designs do not include shields for preventing the starting material from being contaminated during conversion under HP/HT conditions.

As shown in FIG. 4, reaction cell 13 includes a lava cylindrical bushing 101. Positioned concentrically within and adjacent bushing 101 is a graphite electrical resistance heater tube 103. Concentrically within and adjacent tube 103 is a hot pressed boron nitride tube 104 which functions to electrically isolate cell interior from heater tube 103. Within tube 104 there are positioned one at each end, a pair of high temperature electrically insulating end plugs 105, 107 of hot pressed boron nitride, aluminum oxide, lava or equivalent material. Next adjacent end plugs 105, 107 within tube 104 are a pair of carbon plugs 109, 111 which serve as pressure transmitting mediums. A disc of PBN starting material 113 is disposed between carbon plugs 109, 111.

Reaction cell 15 (FIG. 5) is identical to that shown in FIG. 2 except that tube 104 is omitted. The corresponding parts in FIGS. 2 and 3 are identically enumerated.

It will be recognized by those skilled in the art that the reaction cells 11, 13, 15, 201 of FIG. 2 to 5 can be designed to include multiple chambers for the simultaneous conversion of a plurality of PBN samples. This can be accomplished by interleaving a plurality of discs of starting material samples with discs of graphite or other inert dividers.

Operational techniques of simultaneously applying both high pressures and high temperatures in the apparatus described hereinabove are well known to those skilled in the superpressure art. The foregoing description relates to merely one HP/HT apparatus. Various other apparatuses are capable of providing the required pressures and temperatures that may be employed within the scope of this invention.

Figure 6:
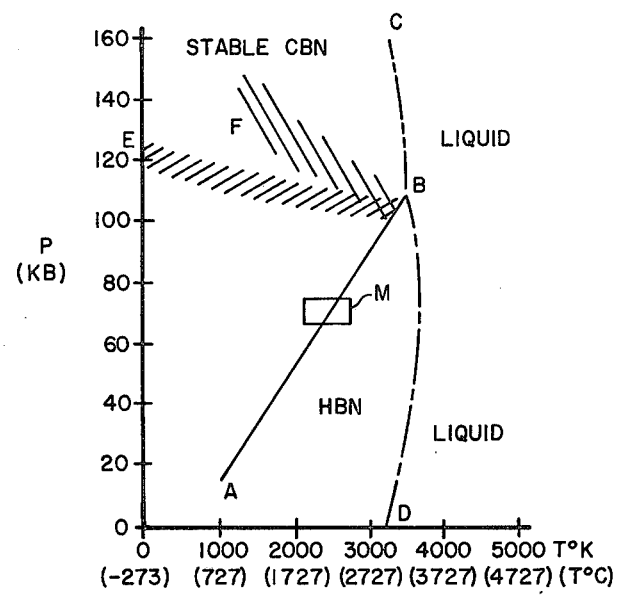
FIG. 6 is the Bundy-Wentorf boron nitride phase diagram.

FIG. 6 shows the boron nitride phase diagram as published by Bundy and Wentorf (J. Chem. Phys., 38, 1144–1149 (1963)). In this diagram, AB is the phase equilibrium boundary for CBN and HBN. At pressures above EB in the region EBC spontaneous conversion of HBN to either WBN or CBN was found to occur. At the lower temperatures, to the left of the hashed marked area FB, in Region FBE, the predominant mode of conversion was to WBN. At the higher temperatures to the right of FB, in Region FBC, the predominate mode of conversion was to CBN.

In practicing the process of this invention a reaction cell containing a PBN sample is placed in a HP/HT apparatus, compressed and then heated under pressure at values of temperature and pressure below the Bundy and Wentorf direct conversion region (i.e., below line EB) of the phase diagram (FIG. 6). The HP/HT conditions are maintained for a length of time sufficient for transformation of the PBN to a strongly sintered CBN cluster compact. The sample is then allowed to sufficiently cool under pressure to prevent reconversion prior to relieving the pressure.

Rectangle M shown in both FIG. 6 and FIG. 7 (discussed below) shows the general relationship of the preferred operating region shown in FIG. 7 relative to the complete Bundy-Wentorf phase diagram (FIG. 6).

Figure 7:
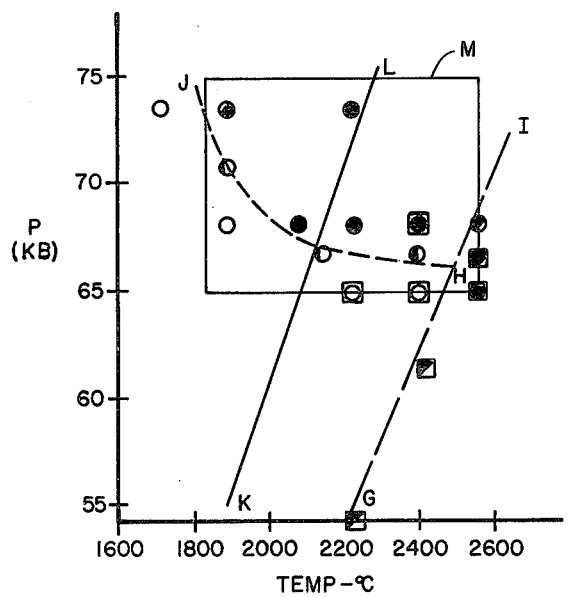
FIG. 7 is a boron nitride phase diagram with data points illustrating the preferred operating region of this invention.
Figure 8:
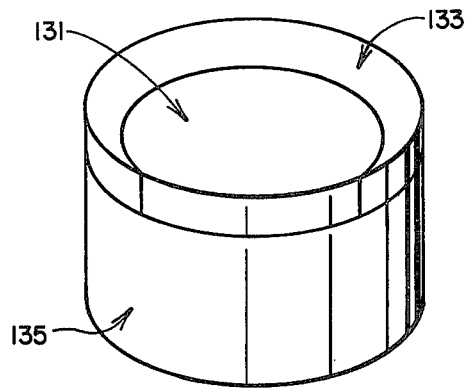
FIG. 8 is a perspective view of a cutting tool insert incorporating a cluster compact made in accordance with this invention.

FIG. 7 shows the results of a series of direct conversion and reconversion experiments in the lower pressure region. The direct conversion experiments were run on PBN samples in FIG. 2 type cells for 10 minute heating times. The reconversion experiments were run on CBN cluster compacts previously prepared by direct conversion of PBN to CBN also in a FIG. 2 type cell for 10 minute heating times. In FIG. 7 conversion of PBN to CBN was obtained within the region JHI and reconversion of CBN to HBN was obtained at temperatures above the line GHI. Also shown in FIG. 8 is a section, KL, of the CBN/HBN equilibrium line AB from the Bundy-Wentorf diagram. The present results indicate that the CBN stability region extends beyond the Bundy-Wentorf equilibrium line KL. Although partial conversion of PBN to CBN was obtained at temperatures of 1850° C. to 1900° C., in practice temperatures above about 2000° C. were found necessary to obtain CBN compacts suitable for machining applications.

In selecting a PBN starting material for practice of this invention, it has been discovered that substrate nucleated PBN should be used in order for the transformation to proceed and for large, strong well-sintered masses to be more consistently produced. If continuously renucleated PBN is used as the starting material, conversion is inhibited.

As used herein, the term substrate nucleated PBN means material in which the concentration of co-deposited gas-phase formed particles (characteristic of continuously renucleated material) is sufficiently low so as not to interfere with conversion of the PBN to a strong tightly bonded, CBN cluster compact.

In the practice of this invention, wide variation in the conversion and sintering behavior of PBN is observed.

The following types of behavior have been observed with PBN disc shaped samples:

A. The PBN does not convert at all.
B. Essentially complete conversion to a strongly bonded (well sintered) cluster compact occurs, but only over a more limited temperature range at temperatures above about 1800° C. to 2000° C.
C. Conversion with strong bonding occurs in layers paralleling the PBN disc top and bottom surfaces with the remainder of the sample remaining unconverted. As in B, this layer type conversion only occurred at temperatures above 1800° C. to 2000° C. and the converted layers were usually located at either the top or bottom surfaces of the PBN disc.
D. PBN essentially completely converted over a more broad temperature range to a poorly sintered cluster compact.

The difference in appearance and properties between the two completely converted types of compacts, B and D above, are quite distinct. Type B compacts are black in appearance and transmit red light while D are opaque grey to milky white in appearance, very similar in color to compacts formed by the direct conversion of HBN powder. Type B compacts are more dense and significantly harder than type D compacts.

It is theorized that variation in conversion behavior is explained by two factors:
1. Variation in the microstructure of PBN.
2. Contamination of the initially pure PBN during conversion under HP/HT conditions apparently by diffusion of active species into the PBN from surrounding cell parts at the high temperature.

In a reaction cell such as cell 11 (FIG. 2) designed to prevent contamination of the PBN by surrounding the PBN with a diffusion barrier only type A, B and C results were obtained. It is believed that the purity of the PBN starting material (99.99+%) is maintained during transformation and thus a very high purity cluster compact 99.99+% is believed to be produced by the practice of this invention.

In cells (e.g. cells 13, 15 in FIGS. 4, 5) where contamination was possible, all four types of conversion were obtained with type D conversion predominant. These results indicate that type D conversion may be contamination induced. It was also determined that the variation in conversion behavior in clean environments (type A, B and C above) may be related to the microstructure of PBN. In particular, the conversion behavior is believed to be correlated to the size of the growth cones observed in PBN, which converted to type B, having noticeably larger (under microscopic observation) growth cone structure than that which did not convert.

The type C layer conversion results were obtained with PBN disc in which variation of the microstructure through the disc was observed with the converting layer having larger growth cones than the unconverting layers. If the material used to obtain type C layer conversion is subject to higher temperatures and pressures type B conversion is obtained. However, the use of such material is not preferred because the use of the higher temperature and pressures significantly increases the cost and difficulty of production of good cluster compacts.

It was further determined that the introduction of various oxides ($Al_2O_3$, $M_gO$ and $B_2O_3$) into otherwise uncontaminated experiments resulted in conversion at temperatures down to the 1500° C. to 1700° C. range, irrespective of the microstructure of the PBN samples. However, the compacts formed in this manner are less dense and of considerably less strength than compacts prepared from substrate nucleated PBN under clean conditions and are similar to the type D compacts obtained in contaminated environments. These results appear to indicate that oxides are the source of contamination and are active in promoting conversion to CBN, but deterimental to sintering.

The compacts prepared by oxide addition (or in contaminated environments) are similar in appearance and strength to compacts prepared by HP/HT conversion of HBN powder. In experiments with continuously renucleated PBN with oxide additions run at temperatures less than that required for conversion to CBN, the continuous turbostratic structure of the PBN plate was found to be recrystallized to HBN powder having the ideal hexagonal structure. These results suggest that in oxide enhanced conversion of PBN, the PBN is first recrystallized to powder form with subsequent conversion of the recrystallized (and contaminated) powder to CBN. This type of mechanism would account for the similarity of compacts obtained by oxide induced conversion of PBN and conversion of BN powder.

The major disadvantage in forming large polycrystalline masses with powdered starting material appears to be that surface contamination of the individual particles inhibit the sintering (bonding) between the particles and thus decrease the strength of the resulting compact. The presence of oxide contamination in the reaction cell, including $B_2O_3$ and moisture, is particularly detrimental to the sintering process.

It is known (e.g., Pub. No. 6) that moisture ($H_2O$) has a catalytic effect on the conversion of HBN powder to CBN, but with detrimental effects on sintering. In accordance with this invention the same effects were observed with various oxides ($Al_2O_3$, $M_gO$, $B_2O_3$) on the PBN conversion (Example 4 below).

In accordance with another feature of this invention, it has been discovered that the structural relationship between the preferentially oriented PBN starting material and the CBN cluster compact is maintained during transition and thus the CBN cluster compact produced is also preferentially oriented.

As discussed in the Background of the Invention, the R-PBN and U-PBN plate material show a preferred orientation of the crystallite c-axes relative to an axis drawn perpendicular to the major planes of the plate sample. R-PBN has a preferred orientation of about 2° or less and U-PBN has preferred crystallite orientation between about 50° to 100°.

In the direct transition of R-PBN to CBN, the epitaxial relationship between the original and converted forms is a parallelism of the hexagonal stacking layers, i.e., the R-PBN (001) plane is substantially parallel to the CBN (111) plane. For U-PBN the orientation of the hexagonal stacking planes is also thought to be the same after conversion to CBN.

For both U-PBN and R-PBN, the activation energies are thought to be about 200 kcal./gm. (which corresponds to the energy of vaporization). These high activation energies imply that the direct conversion process essentially requires disruption of the PBN lattices before the atoms can reform into CBN. The epitaxial relationships observed for both types of PBN indicate that the lattice disruption and reforming into CBN proceeds in a regular fashion without passing through an intermediate disordered phase. X-ray diffraction scans of the converted CBN surfaces, normal to the pressing direction for U-PBN plate, show well-developed CBN (111) and (220) reflections indicating a relatively wide variation in the orientation of the hexagonal stacking planes (or c-axes) is maintained and corresponds to the relatively wide variation in the orientation of the original U-PBN plate. This implies that the hexagonal stacking planes of the CBN are not affected by the direction of the applied pressure (which is applied perpendicular to the hexagonal stacking planes) because they do not become aligned normal to the direction of the applied pressure. With the much narrower c-axes angular distribution in the R-PBN only very weak CBN (200) diffraction is seen. These results indicate that while microrecrystallization of the U-PBN may occur prior to transformation to CBN at high pressure, the U-PBN does not first recrystallize before conversion to the CBN into a highly oriented structure analogous to the structure of R-PBN.

Example 14 hereinbelow relates to the foregoing discussion on the crystal structure of a CBN cluster compact in accord with this invention.

The invention will be better understood by reference to the following Examples:

EXAMPLES

THE PBN used in the following examples was in the form of rectangular plates, 1.65 mm. to 6.4 mm. thick. The plates were cut into approximately 13 mm squares which were hand filed into discs to fit the cylindrical high pressure cells.

After assembly, the cells were placed in a belt apparatus such as in FIG. 2 and compressed to the desired pressure. The sample was then heated by passing an electric current through the cell. The heating was controlled by manually adjusting the power delivered to the cell. After heating for the desired length of time the power was turned off and the sample cooled prior to relieving the pressure.

The composite compacts (standard) which are referred to in the following examples were made in accordance with the teaching of U.S. Pat. No. 3,767,371.

EXAMPLE 1

U-PBN disc shaped samples, approximately 12.6 mm. diameter and 1.65 mm. thick, were placed in cells as shown in FIG. 4. The loaded cells were then compressed to about 65 kbar in a belt apparatus. The samples were heated by passing electric current through the cells. Heating time and temperatures for the various samples are listed in TABLE 1. Although all the samples were converted to polycrystalline CBN, both well sintered strongly bonded cluster compacts and poorly sintered cluster compacts with weak bonding were obtained as shown in TABLE 1.

TABLE 1

| Test | Conditions | | Bonding |
| --- | --- | --- | --- |
| | Temp. (°C.) | Time (min.) | |
| A | 2400 | 30 | Strong |
| B | 2400 | 30 | Strong |
| C | 2400 | 30 | Weak |
| D | 2400 | 30 | Strong |
| E | 2360 | 20 | Strong |
| F | 2360 | 30 | Weak |
| G | 2400 | 30 | Strong |

As a hardness reference, the strong cluster compacts were found to easily scratch composite compacts, while the weak cluster compacts failed to scratch the same composite compacts.

Densities of the two types of cluster compacts were measured using a graded density column with calibrated density floats. The strong compact obtained in Test E gave a measured density of 3.43 g/cm³ compared to a density of 3.48 to 3.49 g/cm³ for single crystal CBN. The weak compact obtained in Test F was found to be considerable less dense, having a density less than 3.36 g/cm³ (the minimum density which could be measured with the density column used).

EXAMPLE 2

A 1.65 mm. thick U-PBN disc was run in a cell as in FIG. 2 at 65 kbar pressure and at approximately 2300° C. to 2400° C. for 30 minutes. A strongly bonded well sintered cluster compact which easily scratched a composite compact was obtained. The sample was diamond ground to remove surface irregularities and polished smooth for hardness testing.

EXAMPLE 3

Three 1.65 mm. thick U-PBN discs were placed in a cell as shown in FIG. 4. The three PBN discs were separated by 2.54 mm. thick carbon spacer discs and run at 65 kbar and at approximately 2300° C. to 2400° C. for 30 minutes. The center PBN disc was converted to a hard strongly bonded CBN cluster compact while the two outer discs were converted to weak CBN cluster compacts. One of the two weak cluster compacts was surface ground and polished for hardness testing.

Hardness tests were conducted on the polished samples of Examples 2 and 3 using a Tukon Tester with a Knoop diamond indentor. The hardness results tabulated in TABLE 2 show the superior hardness of the strongly bonded cluster compacts. For comparison, the measured hardness of composite compacts falls in the 3000–3500 kg/mm$^2$ range for a 3000 g indentor load.

TABLE 2

| | KNOOP HARDNESS (kg/mm$^2$) | |
|---|---|---|
| Indentor Load (g) | Strong PBN Converted Cluster Compact | Weak PBN Converted Cluster Compact |
| 1000 | 6200–8000 | 1000–1200 |
| 2000 | 5800–7600 | 1000–1200 |
| 2500 | | 975–1050 |
| 3500 | 4600–6600 | |

EXAMPLE 4

The following experiments illustrate the effect of various inorganic oxides on the HP/HT conversion behavior of PBN. In these experiments thin layers of $B_2O_3$, MgO and $Al_2O_3$ powders were placed adjacent to 1.65 mm. thick U-PBN discs in cells as shown in FIG. 2. Also, experiments were run on 50 weight percent mixture of PBN powder and $B_2O_3$ powder in a cell as in FIG. 5. The run conditions and results are shown in the following Table:

TABLE 3

| | | Conditions | | | |
|---|---|---|---|---|---|
| Test | Sample | Pressure (kbar) | Temperature (°C.) | Time (min.) | Results |
| 4A | PBN disc | 65 | 1580 | 30 | Unconverted, no recrystallization. |
| 4B | PBN disc/$Al_2O_3$ | 65 | 1580 | 30 | PBN recrystallization and partial conversion to CBN |
| 4C | PBN disc/MgO | 65 | 1580 | 30 | Nearly complete conversion to CBN |
| 4D | PBN disc/$B_2O_3$ | 65 | 1580 | 30 | PBN recrystallization and partial conversion to CBN |
| 4E | 1/1 PBN $B_2O_3$ powder mixture | 65 | 750 | 30 | No effect |
| 4F | 1/1 PBN $B_2O_3$ powder mixture | 65 | 1130 | 30 | Complete recrystallization No conversion to CBN |
| 4G | 1/1 PBN/$B_2O_3$ powder mixture | 65 | 1580 | 30 | Complete conversion to CBN |

These results show the catalytic effect of the various oxides on both this recrystallization and conversion of PBN. Although some strongly bonded polycrystalline CBN fragments were observed in these experiments, the predominant mode of conversion was to low strength pieces.

EXAMPLE 5

A 1.65 mm. thick U-PBN disc was run at conditions of 65 kbar and at 2200° C. to 2300° C. for 30 minutes in a cell as shown in FIG. 2. The sample was partially converted with a strongly bonded polycrystalline CBN layer formed at one surface of the disc while the remainder of the sample was unconverted. Microscopic examination of the PBN plate from which this sample was cut showed a variation in microstructure of the plate. In particular, the growth cones on the side of the plate which experienced conversion were found to be larger and more characteristic of substrate nucleated material than the growth cones on the other side of the plate which did not convert.

EXAMPLE 6

A second U-PBN disc cut from the same PBN plate as in Example 5 was run at 65 kbar and at 2250° C. and 2350° C. watts for 30 minutes also in the cell of FIG. 3 with the same results, i.e., conversion of a strongly bonded layer on one side of the disc with the rest of the sample remaining unconverted.

EXAMPLE 7

Another U-PBN disc in which the microstructure also varied but cut from a different plate than that used in Examples 5 and 6 was also run in a FIG. 2 type cell at 2200° C. to 2300° C. watts and 65 kbar for 30 minutes. As in Examples 5 and 6, one side of the disc had large growth cones characteristic of substrate nucleated material while the other side had smaller growth cones more characteristic of continuously renucleated material. Conversion again only occurred in a layer on the side of the PBN disc with the larger growth cones.

EXAMPLE 8

A 1.65 mm. thick U-PBN disc was processed in the cell of FIG. 5 at 65 kbar and at 2350° C. to 2450° C. for 30 minutes. The resulting strongly bonded CBN cluster compact was surface ground flat on both sides of a thickness of about 0.762 mm. (original thickness was about 1.17 mm.) and epoxy bonded to a 12.7 mm. diameter by 3.17 mm. thick cemented tungsten carbide base. The bonded unit was then cylindrically ground to a diameter of 8.89 mm. for use as a cutting tool insert.

Examples 8A and 8B set forth below illustrate CBN cluster compacts prepared by direct conversion from BN powder.

EXAMPLE 8A

A 0.5 g sample of boron nitride powder (Carborundum Co., Grade HPF) was placed in a FIG. 4 type cell and run at a pressure of about 68 kbar and at a temperature of 2100° C. for 30 minutes. X-ray diffraction analysis of the resulting disc shaped compact showed the BN powder has been converted to CBN. The compact top and bottom surfaces were surface ground flat and the compact was epoxy bonded to a cemented tungsten carbide disc (⅛" thick). The bonded unit was then cylindrically ground to a diameter of 8.89 mm. for use as a cutting tool insert.

EXAMPLE 8B

A 2.0 g sample of the same BN powder as in Example 8A was placed in a FIG. 5 type cell and run at about 68 kbar, 2100° C. for 30 minutes. X-ray diffraction showed the hexagonal BN powder was converted to CBN. The sample was retrieved in the form of three disc shaped slugs. One of the discs was fabricated into a cutting tool insert as described in Example 8A.

In wear test turning an abrasive silica filled hard rubber cylindrical workpiece the directly converted cluster compact showed superior wear resistance compared to a composite compact and to two cluster compacts of Examples 8A and 8B. In these tests the tools were run against the abrasive workpiece for designated time periods after which the edge (land) wear of the tools was measured. The tests were run at a cutting speed of 137 surface meters per minute, a feed rate of 0.127 mm. per revolution and a cutting depth of 0.762 mm. The results are tabulated in Table 4.

TABLE 4

| Compact | Cutting Time (min.) | Tool Edge Wear (mm) |
| --- | --- | --- |
| Example 8 (cluster) | 5 | 0.10 |
|  | 16 | 0.18 |
| Composite | 5 | 0.16 |
|  | 16 | 0.30 |
| Example 8A | 1 | 1.0 |
| Example 8B | 1.5 | 1.4 |

EXAMPLE 9

A 2.41 mm. thick U-PBN disc was run at 65 kbar and at 2200° C. to 2300° C. for 30 minutes in a cell as shown in FIG. 2. Microscopic observation of the PBN plate from which this sample was cut revealed large growth cones typical of substrate nucleated PBN on both plate surfaces. The resulting strongly bonded CBN cluster compact was surface ground flat on both sides and cylindrical ground to 8.89 mm. diameter for use as a cutting tool insert.

EXAMPLE 10

A 1.65 mm. thick U-PBN disc showing large growth cones typical of substrate nucelated pyrolytic BN was run in the same type cell and at the same conditions as Example 9. The resulting strongly bonded cluster compact was also surface ground flat and cylindrical ground to 8.89 mm. diameter for use as a cutting tool insert.

EXAMPLE 11

A 1.65 mm. thick U-PBN disc with large growth cones typical of substrate nucelated pyrolytic BN was run at 65 kbar and 2100° C. to 2200° C. for 30 minutes in a FIG. 4 type cell. The resulting strongly bonded CBN cluster compact was fabricated into a cutting tool insert using the following procedure.

The sample was surface ground flat on one side and cylindrical ground to fit within the 7.44 mm. ID hold of a 16 mm. OD cemented tungsten carbide washer. The sample, carbide washer and a carbide base disc of the same OD as the carbide washer were placed in a carbon susceptor and brazed together to form an integral unit. The brazing material used was a mixture of titanium with a conventional copper, silver, cadmium, zinc alloy marketed under the trademark Easy Flo45.

After brazing, the top surfaces of the carbide washer and sample were ground flat and the unit was ground off-center to expose a cutting edge of the compact thereby to form a cutting tool insert as shown in FIG. 8 which comprises cluster compact 131, carbide washer 133 and carbide base 135.

EXAMPLE 12

A 1.65 mm. thick U-PBN disc was converted to a polycrystalline CBN disc at 65 kbar and 2350° C. to 2450° C. for 30 minutes in a cell of the type shown in FIG. 4. The microstructure of the PBN sample was not known; however, a strongly bonded compact was obtained and was fabricated into a cutting tool insert as described in Example 11.

EXAMPLE 13

A 2.41 mm. thick U-PBN disc was converted in a FIG. 2 type cell at conditions of 65 kbar and 2200° C. to 2300° C. for 30 minutes. The PBN disc had large growth cones typical of substrate nucleated material. The resulting strongly bonded cluster compact was brazed in a tungsten carbide washer on a tungsten carbide base according to the procedure described in Example 11, except the carbide washer had a 0.38" diameter hold and the cluster compact was not cylindrically ground prior to brazing. After (1) brazing the carbide washer, compact and carbide base and (2) surface grinding the washer and compact flat; a solid carbide disc was brazed, using the same braze alloy, to the washer and sample prior to off-center grinding of the unit. After cylindrical grinding, the carbide cap, which completely covered the compact, was surface ground to a thickness of about 0.305 mm. The purpose of the carbide cap being to serve as a chip breaker during cutting operations.

The cutting tools fabricated from directly converted cluster compacts of Examples 8 through 13 were used in cutting tests turning Iconel 718 and T-1 hardened steel workpieces.

Tests against Iconel 718 were made with the tools from Examples 8, 9, 10, 11 and 13 and two standard composite compact insert tools. In these tests each of the tools were run against a solid Iconel 718 log for 1.75 minutes at a feed rate of 0.127 mm. per revolution, a depth of cut of 0.508 mm. and at the cutting speeds shown in Table 5. After testing, the edge wear experienced by each of the samples was measured. The results are tabulated in Table 5.

TABLE 5

| Tool | Type | Speed (sm pm) | Tool Edge Wear (microns) |
| --- | --- | --- | --- |
| Example 8 | Epoxy Bonded | 125 | 150 to 180 |
| Example 9 | Free Standing | 130 | 130 to 150 |
| Example 10 | Free Standing | 143 | 230 |
| Example 11 | Brazed | 119 | 130 |
| Example 13 | Brazed (cap) | 139 | 230 |
| Comp. compact #1 |  | 146 | 180 to 200 |
| Comp. compact #2 |  | 145 | 200 |
| Comp. compact #3 |  | 134 | 200 |

As seen from Table 5, the performance of the directly converted tools is comparable to that for the standard composite compact tools.

Figure 9:
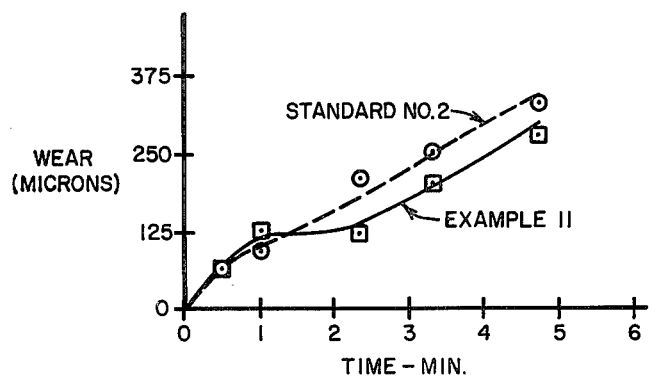
FIGS. 9, 10, and 11 are graphs of compact tool wear as function of time comparing the performance of cluster compact tool made in accordance with this invention to prior art composite compact tools.

The tool from Example 11 and one of the composite compact tools were also tested for longer cutting times against the Iconel 718 log. In these tests the tool edge wear was measured as a function of time. FIG. 9 shows a plot of the tool wear as a function of time for each of the tools and again the performance of the directly cluster compact tool is seen to be compatible to that of the standard composite compact tool.

The tools from Examples 9 and 12 were tested turning T-1 hardened tool steel workpieces. (Hardness = $R_c$ 58 to 60). Two sets of tests at different turning conditions were conducted. In these tests the tool edge wear was measured as a function of cutting time for both the directly converted cluster compacts and standard composite compacts run at the same conditions.

Figure 10:
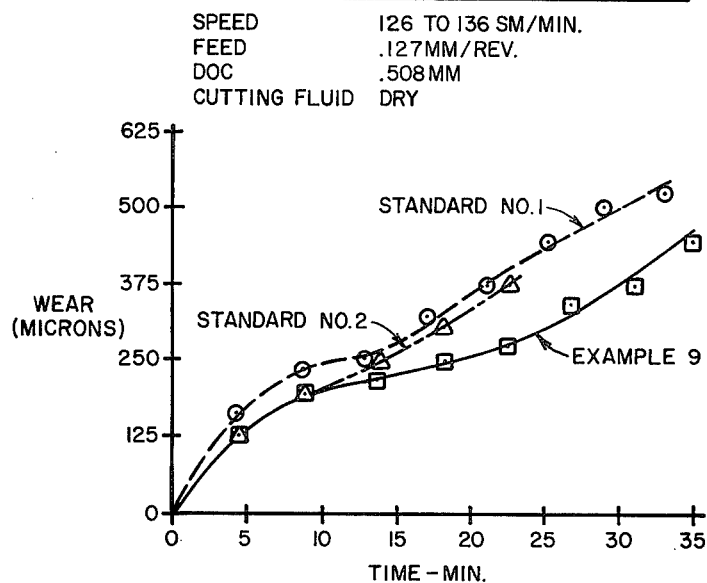
Figure 11:
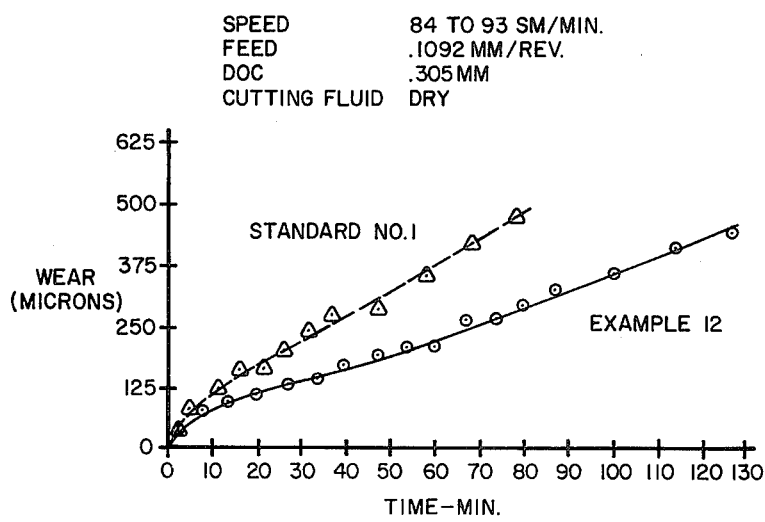

The test conditions and tool life (for 0.38 mm. edge wear) are tabulated in Table 6. FIGS. 10 and 11 show plots of the tool edge wear as a function of time for the high and low speed tests, respectively. The cluster compacts are seen to out-perform the composite compacts standards in both tests. Cemented tungsten carbide inserts (Marketed under Carboloy trademark as grades 883 and 55A) failed rapidly, within about 15 seconds at these conditions.

TABLE 6

| Tool | Type | Feed(m) | Speed(m) | DOC(mm) | Tool Life (min.) |
|---|---|---|---|---|---|
| Example 9 | Free Standing | .127 | 126/136 | .508 | 31 |
| Comp. Compact #1 | | .127 | 126/136 | .508 | 23 |
| Comp. Compact #2 | | .127 | 126/136 | .508 | 24 |
| Example 12 | Brazed | .1244 | 84/93 | .305 | 112 |
| Comp. Compact #2 | | .1092 | 84/93 | .305 | 61 |

EXAMPLE 14

Figure 12:
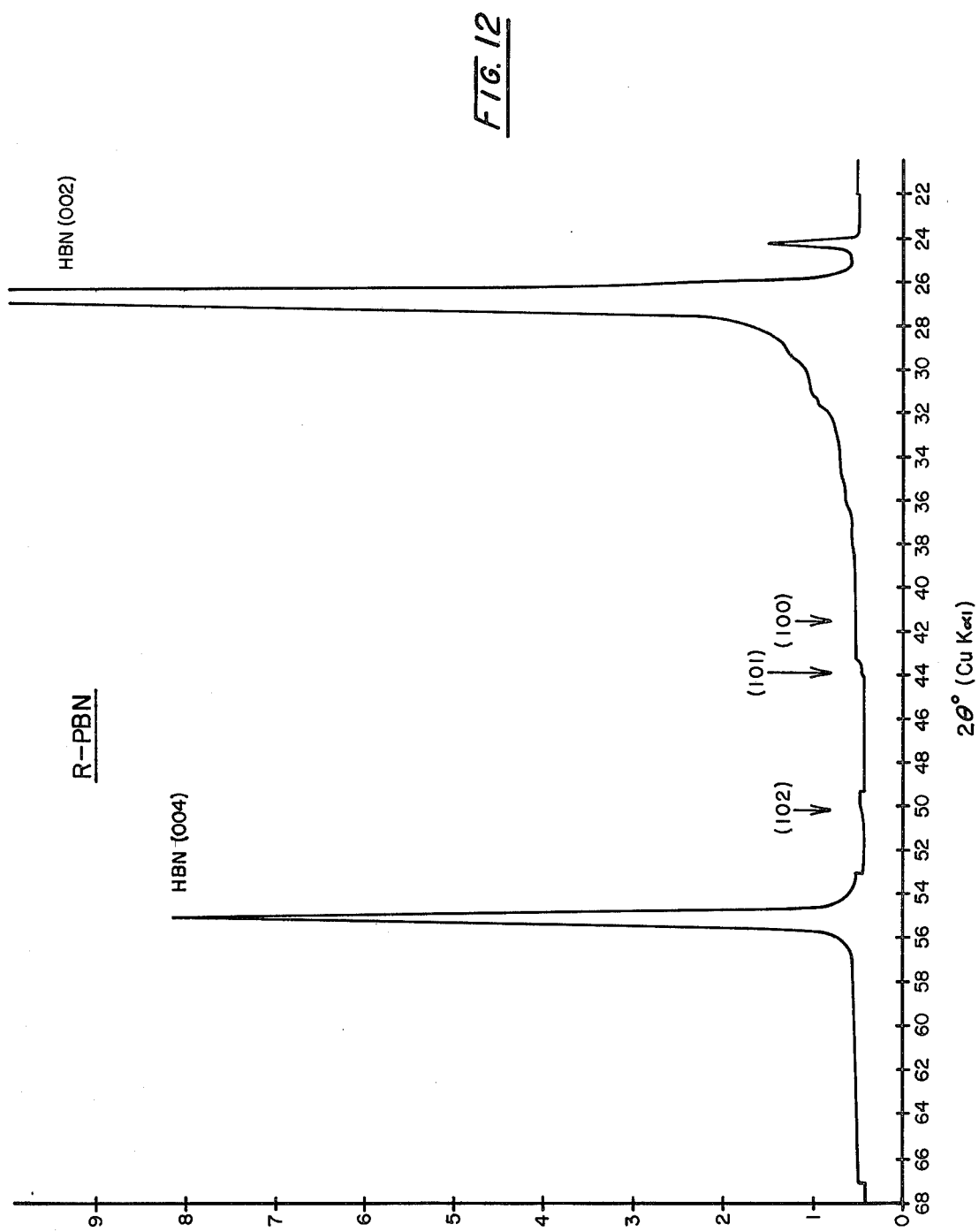
FIG. 12 is an X-ray diffraction graph of R-PBN.

A disc-shaped sample of R-PBN (10 mm. diameter and 15 to 20 mm. thickness) was converted to CBN at a pressure of 65 kilobars and a temperature between about 2200° C. and 2300° C. using a reaction cell analogous to that shown in FIG. 2. FIG. 12 shows an X-ray diffraction pattern obtained with CuK radiation incident to the flat surface on the R-PBN disc. Only (002) and (004) reflection from the graphitic basal planes was observed with all the reflections of the type (h≠0,k,1) being absent in showing the highly oriented nature of the sample with the hexagonal stacking planes parallel to the disc surface (i.e., c-axis is perpendicular to the disc surface).

Figure 13:
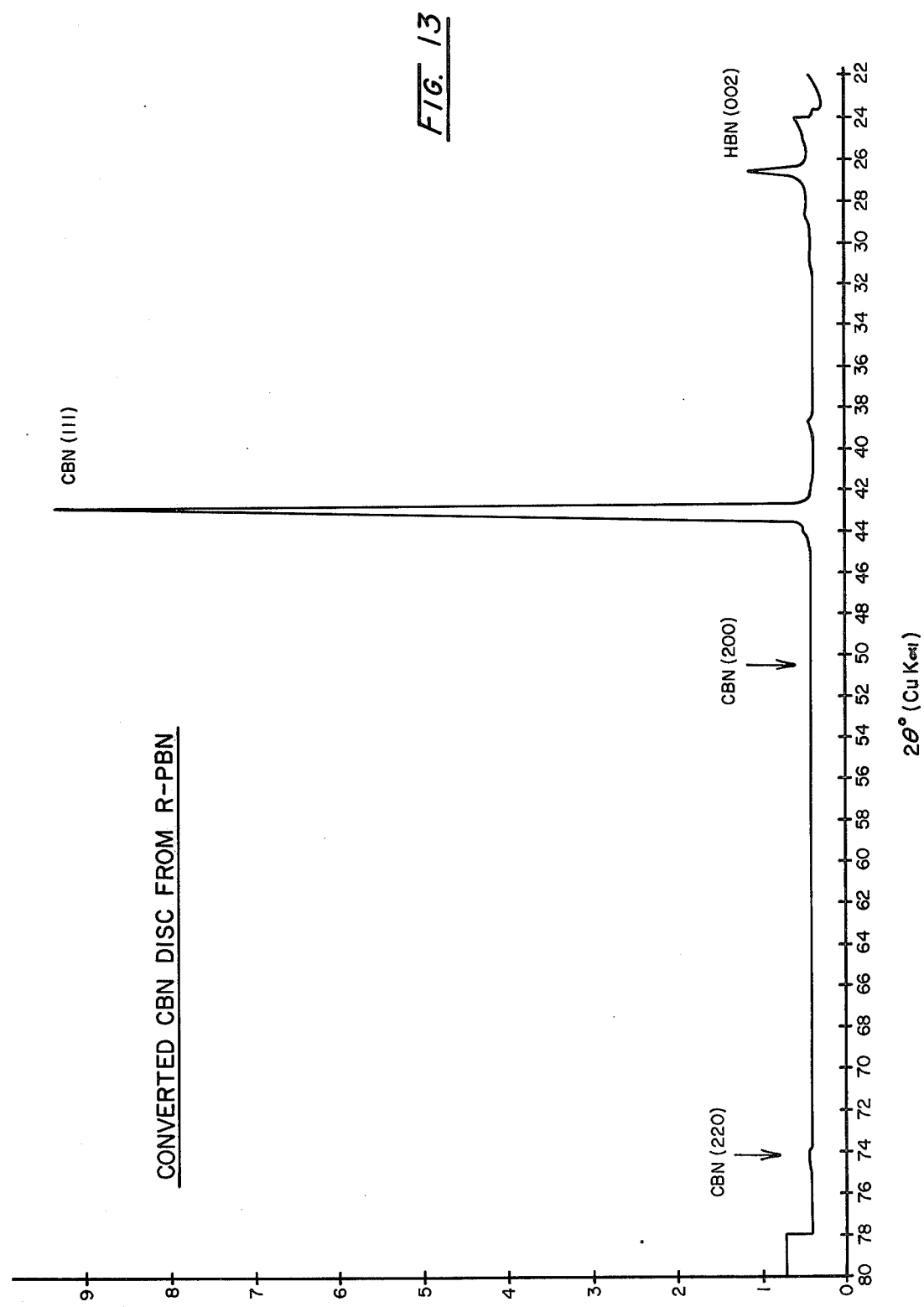
FIG. 13 is an X-ray diffraction graph of a CBN cluster compact of this invention.
Figure 14:
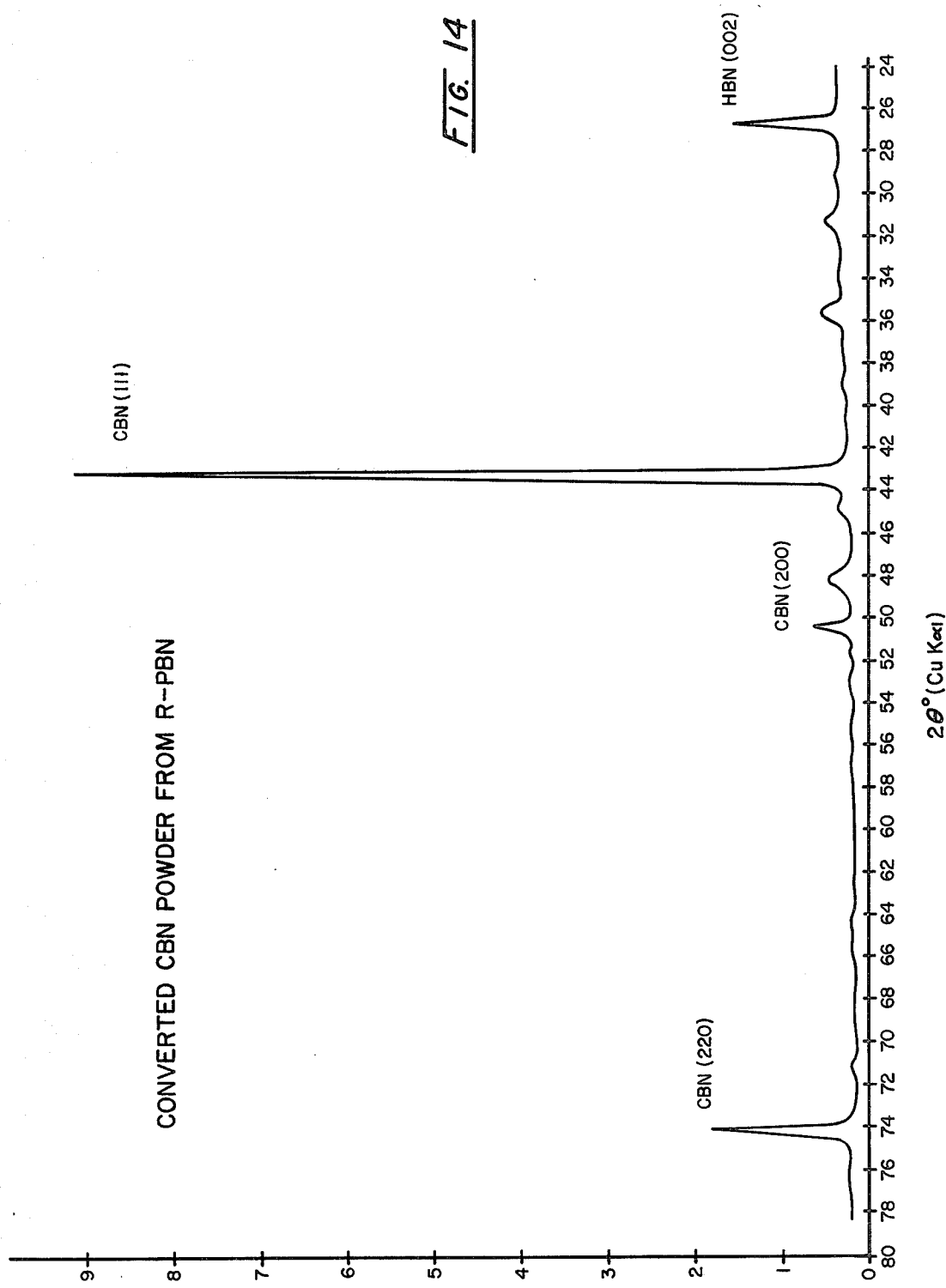
FIG. 14 is an X-ray diffraction graph of a ground powder sample of a CBN cluster compact of this invention.

FIG. 13 shows the diffraction pattern of the same surface of the intact disc after conversion to CBN and FIG. 14 shows the pattern of a powder sample obtained by impact milling of a section of the disc. In FIG. 13 the very weak intensities (or absence) of the (002) and (200) reflections show the disc to be highly oriented with the CBN (111) planes parallel to the surface as were the (001) planes in the original R-PBN sample. Thus, the c-axis (001) direction of the original R-PBN becomes the (111) direction in the converted CBN disc. In FIG. 14 the (200) and (220) reflections are evident in the more random powder sampled.

Portions of the converted disc were successively surfaced ground away (up to approximately one-half thickness) and the diffraction patterns of the successively exposed surfaces showed the peferred orientation to extend through the interior of the sample.

In the practice of the method for transforming PBN into a CBN cluster compact in accordance with this invention, it has been discovered that with increasing transformation or HP/HT processing temperature there is a gradual increase in thermal conductivity of the compact produced until a temperature of about 2200° C. is reached, after which the thermal conductivity increases sharply with increasing temperature. It has also been found that the thermal conductivity is directly related to the crystallite size of the compact. The compacts are characterized by having measured room temperature thermal conductivities of from about 3 watts/cm°K to 9 watts/cm°K, depending on crystallite size. It is believed that these discoveries may be explained by the fact that in nonmetallic electrically insulating crystals thermal energy is conducted by lattice waves (phonons) and is directly proportional to the phonon mean free path and that lattice imperfections on the same scale as the phonon mean path for perfect crystals tend to reduce the phonon mean free path and thus decrease the thermal conductivity.

The larger crystallite size compacts (higher k compacts) show T-1 behavior of the thermal conductivity characteristic of pure phonon/phonon scattering limited heat transfer (i.e., little or no phonon scattering is occurring at crystallite boundaries). The compacts are free of secondary binder/catalyst phases which would limit the thermal conductivity obtainable. Because of the high purity of the initial PBN starting material and processing under clean conditions, it is believed the compacts are free of impurities which would act as phonon scattering centers and limit the thermal conductivity. Also because of its high purity and the absence of electrically conductive phases, such compacts posses high electrical resistance, low relative permittivity and a low dielectric loss tangent.

The compacts show preferred orientation of the crystallites, retaining the preferred orientation characteristics of the PBN starting material. Since the interface phonon scattering between crystallites is proportional to the degree of crystallite lattice mismatch, the interface thermal resistance between crystallites would be less because of the preferred orientation that the interface thermal resistance of more randomly oriented compacts obtained by sintering of CBN powders or direct conversion of HBN powder.

The practice of this invention to produce CBN cluster compacts having a high thermal conductivity will be better understood from a consideration of the following examples.

EXAMPLES 15–30

In Examples 15–28 a plurality of cluster compacts were prepared from bevel-edged disc shaped samples of U-PBN in a reaction cell such as shown in FIG. 3. All examples, except Example 30 which was run at 45 to 50 kbars, were run at about 70 kbar at the temperature and time tabulated in Table 7. The times listed in Table 7 are times at the maximum temperature, i.e., each value given is the total heat treatment time less the time required to reach the maximum temperature.

Examples 29 and 30 represent a prior art directly converted HBN powder compact and a prior art CBN composite compact, respectively, and are included in Table 7 for purposes of comparison.

In Example 29, directly converted HBN power compact was prepared by direct conversion of a 1.4 g sample of HBN powder (Carborundum Company Grade HPF). The sample was placed in cell shown in FIG. 3 and processed at the temperature and time indicated in Table 7.

After conversion, the compacts of Examples 15–29 were surface ground flat and parallel and analyzed by X-ray diffraction. The diameter of the directly converted samples varied from approximately 11.7 to 12.4 mm. with thicknesses ranging from 1.57 to 3.66 mm. The sample densities tabulated in Table 7 were then determined. Except for the examples 24, 27 and 28 prepared at the lowest temperatures, the densities are, within experimental error, equal to the single crystal density.

In Example 30, a cluster compact sample was prepared from a composite compact by removal of the carbide substrate by grinding and lapping until all carbide traces were gone. The final thickness was 0.94 mm.

The effective crystallite size of the compacts was determined by analysis of X-ray diffraction line (or peak) width. Analysis by this technique is based upon the fact that deviations from perfect crystalline structure, such as decreased crystallite size, lattice distortion resulting from non-uniform strain or lattice imperfections may result in extra peak width broadening. Because of the nature of the X-ray scattering process line width broadening only occurs if the crystallite size or lattice imperfection separation is less than about 1000 Å (0.1 micron), i.e., the diffracting beam cannot detect lattice distortion at distances greater than about 1000 Å.

In non-metallic insulating crystals thermal energy is conducted by lattice waves (phonons). In good thermally conducting insulating crystals such as high purity diamond of CBN single crystals the room temperature mean free path of the thermal conducting phonons may be of the order of 1000 Å or greater, with the mean free path increasing at lower temperatures and decreasing at higher temperatures. Since the thermal energy in these crystals is transferred by lattice waves, lattice imperfections on the same scale as the phonon mean path for perfect crystals tends to reduce the phonon mean free path and thus decrease the thermal conductivity (thermal conductivity is directly proportional to the phonon mean free path).

Lattice imperfections on a scale which results in X-ray diffraction line width broadening is of the same order (or less) than the room temperature phonon mean free path in CBN, i.e., lattice imperfections on a scale which causes X-ray diffraction line width broadening may be expected to affect the room temperature thermal conductivity in a negative manner.

For line broadening due to crystallite size reduction only, the effective crystallite size or relative crystallite perfection can be estimated from the relation:

$$t = \frac{0.9\lambda}{B \cos \theta}$$

where t is the crystallite thickness perpendicular to the diffraction planes, $\theta$ the diffraction angle, $\lambda$ the wavelength of the X-radiation and B is related to the peak width by $$B^2 = B_M^2 - B_s^2$$

where $B_M$ is the peak width measured at half maximum intensity (FWHM) and $B_s$ is the peak width of a reference standard of large crystallite size (i.e., instrumental peak width).

While the above formula applies only to line broadening due to crystallite size effects and is not very accurate even in that case, tending to underestimate the crystallite size, it is useful as a parameter for comparing relative values of "effective crystallite size", or relative crystalline perfection on a microscale.

X-ray diffraction line width broadening scans were taken of the CBN (111) and CBN (220) diffraction peaks of each of Examples 15–30. The calculated effective crystallite thicknesses in the CBN [111] direction are tabulated in Table 7 in which a more or less general increase in the crystallite size with increasing processing temperature is noted for the PBN compacts. A similar increase in size with increasing processing temperature was also observed in the [220] direction. The residual compressed HBN peak intensities observed for the thermal diffusivity samples are tabulated in Table 7.

X-ray analysis of Example 29 and of other HBN powder converted compacts formed in a FIG. 3 type cell at various temperatures also revealed that crystallite size increases with increasing temperature. Important differences, however, were observed in the higher temperature region. With the PBN starting material a gradual increase in crystallite size occurred with increasing temperature until temperatures in the region of about 2200° C. was reached where the growth increased much more than dramatically with increasing temperature. With the HBN powder starting material, the rate of increase in size with increasing temperature was constant up to the reconversion temperature.

Figure 15:
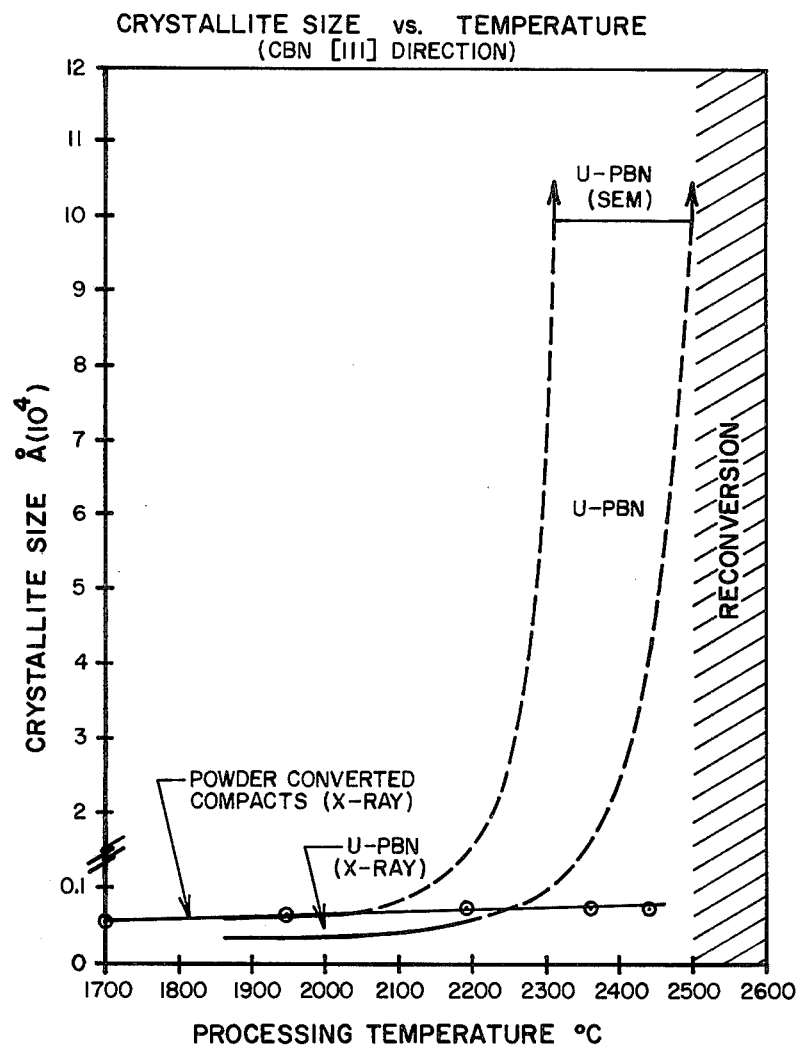
FIG. 15 is a graph of the crystallite size versus processing temperature of a cluster compact in accordance with this invention.

FIG. 15 illustrates the crystallite size as a function of HP/HT processing temperature (Table 7, column 5) of Examples 15–30 and a plurality of other cluster compacts similarly prepared by direct conversion of U-PBN and HBN powder. In the lower temperature solid line bounded U-PBN (X-ray) region the crystallite size in the U-PBN compacts was determined by X-ray diffraction line broadening. The spread in this area represents the variation found in the crystallite size versus temperature data which is believed to be due to lot-to-lot variation in the structure of the U-PBN starting material. At higher temperatures the crystallite size in the U-PBN compacts becomes too large to be determined by X-ray diffraction. In the high temperature region, designated U-PBN (SEM) in FIG. 15 scanning electron microscope (SEM) analysis indicated crystallite sizes in the 10 to 20+ micron range for a large crystallite size compact. The dashed line U-PBN region connects the X-ray and SEM regions. In this region where the sharp upswing of the curve occurs, the crsyallite size is too large to be determined by X-ray diffraction and too small to be investigated with the SEM available. With the HBN powder converted compacts the crystallite size remained sufficiently small to be determined by X-ray analysis up to the highest temperatures.

The different crystal growth behavior of the U-PBN and HBN powder converted compacts may be speculated on as follows: The HBN powder starting material is composed of individual platelet type particles of submicron thickness. On conversion of the individual particles the crystallite size in the particle is diminished. Crystallite growth can then occur within each particle. However, the extent of crystallite growth is limited by the individual particle boundaries, i.e., crystallite growth does not proceed across particle to particle interfaces and thus the maximum crystallite size is limited by the size of the individual powder particles in the starting HBN powder.

With PBN, however, no discrete particles exist. The PBN structure, although highly disordered, is continuous in three dimensions. The PBN starting material disc may be viewed as one large, albeit highly imperfect crystal and therefore resultant crystallite growth after conversion to CBN is not limited by individual particle boundaries as with the HBN powder starting materials. It is thought that conversion in PBN proceeds directly from the turbostratic PBN structure to a quasi-amorphous CBN structure from which crystal growth then proceeds, i.e., the conversion is not thought to proceed by initial recrystallization of the turbostratic structure to the hexagonal structure prior to conversion of CBN. The turbostatic structure of PBN is stable to very high temperatures-recrystallization to the HBN structure does not occur at atmospheric pressure up to the sublimation temperature (2300° C. to 2400° C.). Recrystallization may occur under low pressure uniaxial compression, but only at temperatures of 2300° C. or greater, i.e., higher than the high pressure PBN to CBN conversion temperature (1700° C. to 1800° C.).

Thermal diffusivity measurements on the compacts were made using a flash heating method. The flash method involves subjecting the front face of the compact to a short energy pulse and monitoring the resultant temperature rise of the rear face. A solid state laser is preferably used as the energy source and the thermal diffusivity is calculated from the rear surface temperature history. Measurements were made over the temperature range from −100° C. to 650° C.

The measured thermal diffusivity values, $\alpha$, are converted to thermal conductivity, k, using the defining relation $$k = \alpha C_p \rho$$

where $C_p$ is the specific heat and $\rho$ the mass density. Densities were determined by the immersion of sink float technique and known values were used for the specific heat.

Figure 16:
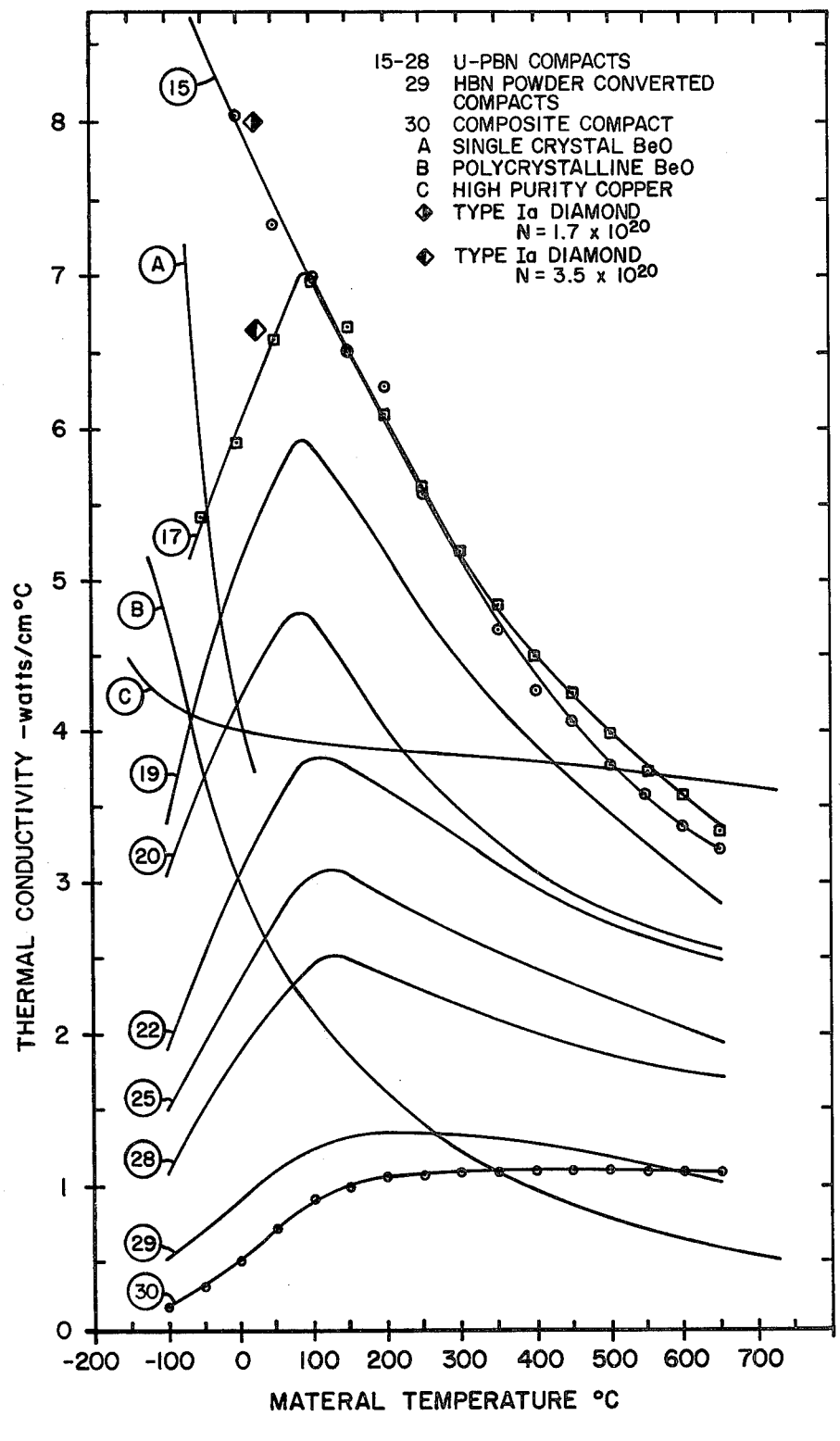
FIG. 16 is a graph of the thermal conductivity versus the material temperature of various materials including cluster compacts in accordance with this invention.

The thermal conductivity results are plotted in FIG. 16. Also shown in FIG. 16 are the thermal conductivities of high purity copper, polycrystalline and single crystal BeO as well as room temperature thermal conductivity values for Type Ia natural single crystal diamonds of various nitrogen concentrations for reference.

Figure 17:
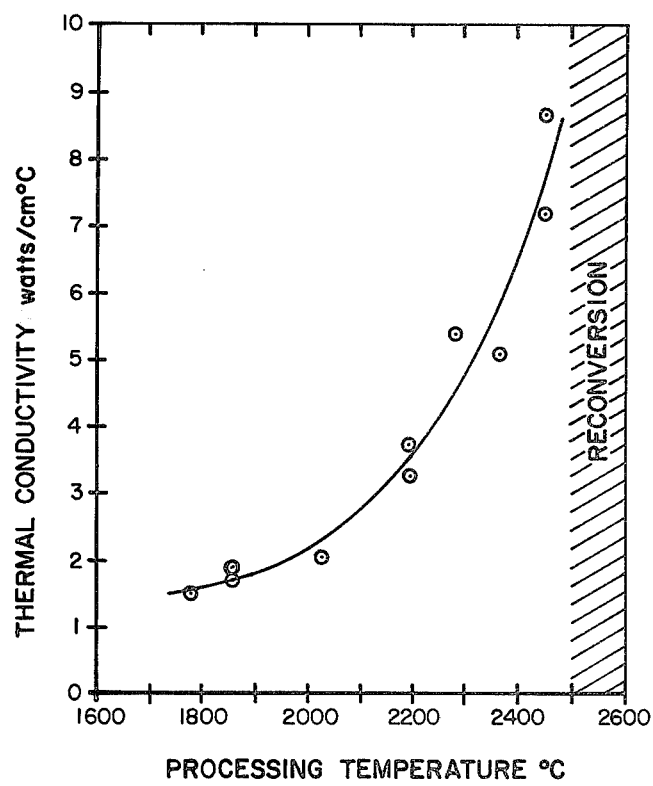
FIG. 17 is a graph of the thermal conductivity versus processing temperature of a cluster compact in accordance with this invention.

From Table 7 and FIG. 16 an increase in the thermal conductivity with increasing processing temperature is noted for the U-PBN compacts. This is shown graphically in FIG. 17 where the thermal conductivity at −50° C. of Examples 16–18, 20, 21, and 24–28 are plotted as a function of maximum processing temperature.

Accompanying the increase in k with increasing processing temperature is a more or less general increase in the effective crystallite size and a decrease in the amount of unconverted residual compressed HBN phase. Both of these effects contribute to the decrease in k at the lower processing temperatures. In the room temperature region a factor of 3 to 4 improvements in the thermal conductivity is observed between the high and low temperature U-PBN compacts. This difference is attributed to increased phonon scattering resulting from crystalline imperfections (decreased crystallite size) and increased thermal resistance resulting from the residual unconverted HBN phase in the lower temperature compacts.

The room temperature thermal conductivity of the best U-PBN compacts is higher by a factor of 6–8 compared to the directly converted HBN powder compact (Example 29) and by a factor of about 10 compared to the composite compact (Example 30). In addition, the conductivity of the HBN powder converted compact is significantly lower (by a factor of about 4) than PBN compacts showing similar X-ray line width broadening. The extra thermal resistance of the HBN power coverted compact is attributed to increased intergrain thermal resistance in this compact. Likewise, the thermal conductivity of the composite compact is considerable less than U-PBN compacts of comparable X-ray line width broadening which is again attributed to increased intergrain thermal resistance in the composite compact.

Relative to copper, a PBN compact in accordance with this invention has higher thermal conductivities, approaching a factor of 2 improvement in the room temperature to 200° C. range. Likewise the thermal conductivity are well in excess of that for polycrystalline BeO over the temperature range investigated (a factor of about 4 improvement in the room temperature region).

Figure 18:
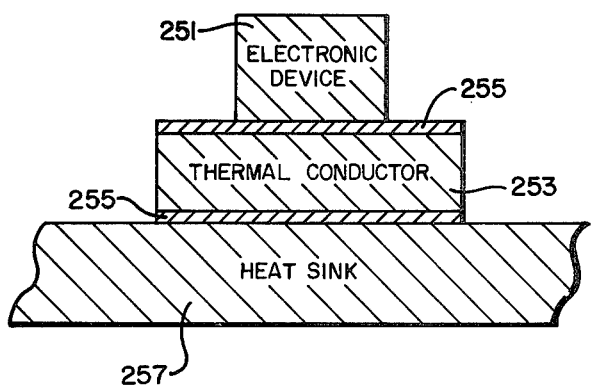
FIG. 18 is a schematic illustration of an electronic device with a CBN compact heat sink in accordance with the features of this invention.

FIG. 18 shows in schematic form an embodiment of this invention which illustrates how a CBN cluster compact (illustrated as thermal conductor 253) having a high thermal conductivity as disclosed herein may be used to provide a heat sink for an electronic device 251. For heat sinking device 251, a high thermal conductivity material 253 (CBN cluster compact) is bonded by brazing alloy layers 255 intermediate device 251 and a large heat sink 257.

Techniques for forming layers 255 include metallization of this substrate material using a very thin supported epitaxial nickel film as disclosed in Hudson, J. Phys. D: Appl. Phys. 9, 225 (1976), and the use of a high thermal conductivity silver based bonding alloy as disclosed in U.S. patent application Ser. No. 645,786-Knapp, et al; filed Dec. 31, 1975, the disclosures of which are hereby incorporated by reference herein.

While a specific method and apparatus in accordance with this invention has been shown and described, it is not desired that the invention be limited to the particular description nor to the particular configurations illustrated, and it is intended by the appended claims to cover all modifications within the spirit and scope of the invention.

TABLE 7

THERMAL CONDUCTIVITY EXAMPLES

| Example Number | Type | Thickness (mm.) | Density (g/cm³) | Processing Max. Temp. (°C.) | Conditions Time (min.) | Effective Crystallite Size (A) | Peak k ($\frac{Watts}{cm \, °C.}$) | Compressed HBN (002) Intensity |
|---|---|---|---|---|---|---|---|---|
| 15 | U-PBN | 2.84 | 3.49 | 2440 | 4–6 | * | 9.0 | 0 |
| 16 | U-PBN | 3.33 | 3.50 | 2440 | 2–3 | * | 7.5 | 0 |

TABLE 7-continued
THERMAL CONDUCTIVITY EXAMPLES

| Example Number | Type | Thickness (mm.) | Density (g/cm³) | Processing Max. Temp. (°C.) | Conditions Time (min.) | Effective Crystallite Size (A) | Peak k ( Watts / cm °C. ) | Compressed HBN (002) Intensity |
|---|---|---|---|---|---|---|---|---|
| 17 | U-PBN | 1.60 | 3.50 | 2275 | 2–3 | * | 7.0 | 0 |
| 18 | U-PBN | 1.57 | 3.48 | 2360 | 2–3 | * | 6.7 | 0 |
| 19 | U-PBN | 3.66 | 3.48 | 2440 | 0–1 | * | 5.9 | 0 |
| 20 | U-PBN | 1.60 | 3.49 | 2190 | 2–3 | * | 4.8 | 0 |
| 21 | U-PBN | 1.95 | 3.49 | 2190 | 2–3 | 735 | 4.35 | 30 |
| 22 | U-PBN | 3.35 | 3.48 | 2360 | 0–1 | 882 | 3.82 | 13 |
| 23 | U-PBN | 3.65 | 3.47 | ** | ** | 686 | 3.45 | 33 |
| 24 | U-PBN | 2.77 | 3.42 | 2025 | 7 | 485 | 3.17 | 73 |
| 25 | U-PBN | 3.05 | 3.47 | 1860 | 17 | 500 | 3.08 | 29 |
| 26 | U-PBN | 1.60 | 3.47 | 1860 | 17 | 475 | 2.95 | 25 |
| 27 | U-PBN | 1.93 | 3.36 | 1860 | 17 | 390 | 2.60 | 496 |
| 28 | U-PBN | 1.63 | 3.40 | 1780 | 17 | 340 | 2.50 | 242 |
| 29 | HBN Powder | 2.21 | 3.42 | 2440 | 2–3 | 770 | 1.33 | 0 |
| 30 | Composite Compct. | .940 | 4.06 | 1500 | 15 | 320 | 1.07 | 0 |

\* Crystallite size too large for X-ray diffraction technique.
\*\* Heating was varied to rapidly to define time and temperature conditions.

What I claim as new and desire to secure by Letters Patent of the United States is:

1. A high temperature and pressure process for making a sintered polycrystalline cubic boron nitride compact, said process comprising the steps of:
   (a) placing preferentially oriented pyrolytic hexagonal boron nitride in a reaction cell, said boron nitride being substantially free of catalytically active materials, said cell having means for shielding said pyrolytic boron nitride from contamination during transformation;
   (b) compressing said cell and the contents thereof at a pressure between about 50 kbars and 100 kbars;
   (c) heating said cell and the contents thereof to a temperature of at least about 1800° C. within the cubic boron nitride stable region of the boron nitride phase diagram;
   (d) maintaining said pressure and temperature conditions of steps (b) and (c) for a period of time sufficient to transform said pyrolytic boron nitride into a sintered polycrystalline cubic boron nitride compact;
   (e) ceasing the heating of said cell; and
   (f) removing the pressure applied to said cell.

2. The process of claim 1 wherein said pyrolytic hexagonal boron nitride is formed by substrate nucleation.

3. The process of claim 1 wherein said pyrolytic boron nitride is greater than 99.99% boron nitride.

4. The process of claim 1 wherein said pyrolytic boron nitride has a density between 1.8 to 2.28 g/cm³.

5. The process of claim 1 wherein said shielding means is a metallic shield for surrounding said boron nitride during transformation.

6. The process of claim 1 wherein said boron nitride is a unitary body.

7. The process of claim 6 wherein said body is a bevel-edged disc.

* * * * *